(12) United States Patent
Cooper (10) Patent No.: US 6,724,330 B1
(45) Date of Patent: Apr. 20, 2004

(54) PREFIX TABLE IMPLEMENTED DATA COMPRESSION METHOD AND APPARATUS UTILIZING STRING CODE REASSIGNMENT

(75) Inventor: Albert B. Cooper, New York, NY (US)

(73) Assignee: Unisys Corporation, Blue Bell, PA (US)

( * ) Notice: Subject to any disclaimer, the term of this patent is extended or adjusted under 35 U.S.C. 154(b) by 12 days.

(21) Appl. No.: 10/313,192

(22) Filed: Dec. 7, 2002

(51) Int. Cl.[7] ............................................... H03M 7/00
(52) U.S. Cl. ....................................................... 341/106
(58) Field of Search ............................. 341/50, 51, 87, 341/67, 106

(56) References Cited

U.S. PATENT DOCUMENTS

| | | | |
|---|---|---|---|
| 4,814,746 A | 3/1989 | Miller et al. | |
| 4,876,541 A | 10/1989 | Storer | |
| 5,153,591 A | 10/1992 | Clark | |
| 6,628,211 B1 | * 9/2003 | Cooper | .......................... 341/50 |

OTHER PUBLICATIONS

MacCrisken, John E., "V.42 bis: The New Modem Compression Standard", pp. 23–29, *Journal of Data and Computer Communications*, Spring 1991.

CCITT Recommendation V.42 bis, Data Compression Procedures for Data Circuit Terminating Equipment (DCE) Using Error Correction Procedures, Geneva 1990.

* cited by examiner

*Primary Examiner*—Brian Young
(74) *Attorney, Agent, or Firm*—Albert B. Cooper; Mark T. Starr (57) ABSTRACT

The disclosed compressor utilizes a plurality of prefix tables corresponding to respective prefix codes. A string is stored by storing the code associated with the string in a prefix table corresponding to the code of the string prefix at a prefix table location corresponding to the extension character of the string. The input data character stream is searched by comparing the input stream to the stored strings to determine the longest match therewith. The code associated with the longest match is outputted so as to provide the output stream of compressed codes. The stored strings are updated by inserting an extended string into the prefix tables, the extended string comprising the longest match extended by the next data character in the input stream following the longest match, the extended string being stored in the prefix table corresponding to the code of the longest match, a code being assigned to the extended string. A code is deleted from a prefix table for reassignment to an extended string to be inserted when further codes are unavailable for assignment. A code is selected for reassignment when the prefix table corresponding to the code is empty or has not been established.

40 Claims, 6 Drawing Sheets

PREFIX TABLE IMPLEMENTED DATA COMPRESSION METHOD AND APPARATUS UTILIZING STRING CODE REASSIGNMENT

CROSS REFERENCE TO RELATED APPLICATION

U.S. patent application Ser. No. 10/101,046 "Prefix Table Implemented Data Compression Method and Apparatus" by Cooper, filed Mar. 19, 2002, discloses a prefix table implementation for LZ dictionary type compressors.

Said Ser. No. 10/101,046 is incorporated herein by reference.

BACKGROUND OF THE INVENTION

1. Field of the Invention

The invention relates to LZ data compression systems particularly with respect to the LZW compression methodology. More particularly, the invention relates to a novel string deletion process for recovering string codes in a prefix table string storage arrangement such as that described in said Ser. No. 10/101,046.

2. Description of the Prior Art

Professors Abraham Lempel and Jacob Ziv provided the theoretical basis for LZ data compression and decompression systems that are in present day widespread usage. Two of their seminal papers appear in the IEEE Transactions on Information Theory, IT-23-3, May 1977, pp. 337–343 and in the IEEE Transactions on Information Theory, IT-24-5, September 1978, pp. 530–536. A ubiquitously used data compression and decompression system known as LZW is described in U.S. Pat. 4,558,302 by Welch, issued Dec. 10, 1985. LZW has been adopted as the compression and decompression standard used in the GIF image communication protocol and is utilized in the TIFF image communication protocol. GIF is a development of CompuServe Incorporated and the name GIF is a Service Mark thereof. A reference to the GIF specification is found in GRAPHICS INTERCHANGE FORMAT, Version 89a, Jul. 31, 1990. TIFF is a development of Aldus Corporation and the name TIFF is a Trademark thereof. Reference to the TIFF specification is found in TIFF, Revision 6.0, Final—Jun. 3, 1992.

LZW has also been adopted as the standard for V.42 bis modem compression and decompression. A reference to the V.42 bis standard is found in CCITT Recommendation V.42 bis, Data Compression Procedures For Data Circuit Terminating Equipment (DCE) Using Error Correction Procedures, Geneva 1990. The V.42 bis standard is further described in an article entitled "V.42 bis: The New Modem Compression Standard" by J. E. MacCrisken in the Spring 1991 issue of the Journal Of Data & Computer Communications—Modem Compression, pages 23–29.

Examples of LZ dictionary based compression and decompression systems are described in the following U.S. patents: U.S. Pat. No. 4,464,650 by Eastman et al., issued Aug. 7, 1984; U.S. Pat. No. 4,814,746 by Miller et al., issued Mar. 21, 1989; U.S. Pat. No. 4,876,541 by Storer, issued Oct. 24, 1989; U.S. Pat. No. 5,153,591 by Clark, issued Oct. 6, 1992; U.S. Pat. No. 5,373,290 by Lempel et al., issued Dec. 13, 1994; U.S. Pat. No. 5,838,264 by Cooper, issued Nov. 17, 1998; and U.S. Pat. No. 5,861,827 by Welch et al., issued Jan. 19, 1999.

In the above dictionary based LZ compression and decompression systems, the compressor and decompressor dictionaries may be initialized with all of the single character strings of the character alphabet. In some implementations, the single character strings are considered as recognized and matched although not explicitly stored. In such systems the value of the single character may be utilized as its code and the first available code utilized for multiple character strings would have a value greater than the single character values. In this way the decompressor can distinguish between a single character string and a multiple character string and recover the characters thereof. For example, in the ASCII environment, the alphabet has an 8 bit character size supporting an alphabet of 256 characters. Thus, the characters have values of 0–255. The first available multiple character string code can, for example, be 258 where the codes 256 and 257 are utilized as control codes as is well known.

In the prior art dictionary based LZ compression systems, data character strings are deleted utilizing procedures such as those described in said U.S. Pat. No. 4,814,746; 4,876,541; 5,153,591 as well as in said CCITT V.42 bis standard. The implementations of the prior art string deletion algorithms involve varying degrees of complexity. The prefix table string storage architecture of said Ser. No. 10/101,046 is particularly suited for including a relatively uncomplicated string deletion algorithm. A string deletion algorithm for use with the prefix table architecture of said Ser. No. 10/101,046 does not yet exist in the prior art.

SUMMARY OF THE INVENTION

The present invention provides a novel string deletion algorithm particularly adapted to the prefix table string storage architecture of said Ser. No. 10/101,046.

In the embodiments of the present invention a plurality of prefix tables corresponding to the respective plurality of prefix codes are utilized. A string is stored in the prefix tables by storing the code associated with the string in the prefix table corresponding to the code of the string prefix at a prefix table location corresponding to the extension character of the string. The input data character stream is searched by comparing the input stream to the stored strings to determine the longest match therewith. The code associated with the longest match is outputted so as to provide the output stream of compressed codes. The stored strings are updated by inserting an extended string into the prefix tables, the extended string comprising the longest match extended by the next data character in the input stream following the longest match, the extended string being stored in the prefix table corresponding to the code of the longest match, a code being assigned to the extended string. A code is deleted from a prefix table for reassignment to an extended string to be inserted when further codes are unavailable for assignment.

A particular code is selected for reassignment by determining that the prefix table corresponding to the particular code indicates that the string represented by the particular code has not been extended. Specifically, the particular code is selected by determining that the prefix table corresponding to the code is empty or has not been established.

Alternative embodiments of the invention include creating the prefix tables when the strings corresponding to the associated prefix codes are first matched in the input or creating the table locations as update extended strings are encountered and storing the extension character of the update extended string together with the code of the string at the created table location.

DESCRIPTION OF THE PREFERRED EMBODIMENTS

The best mode embodiments described below, utilizing the Prefix Table implementation architecture of the present invention, are predicated, generally, on the LZW methodology. The embodiments utilize an implementation feature similar to that described above where the single character strings are considered as recognized and matched by the compressor although not explicitly initialized therein.

Figure 1:
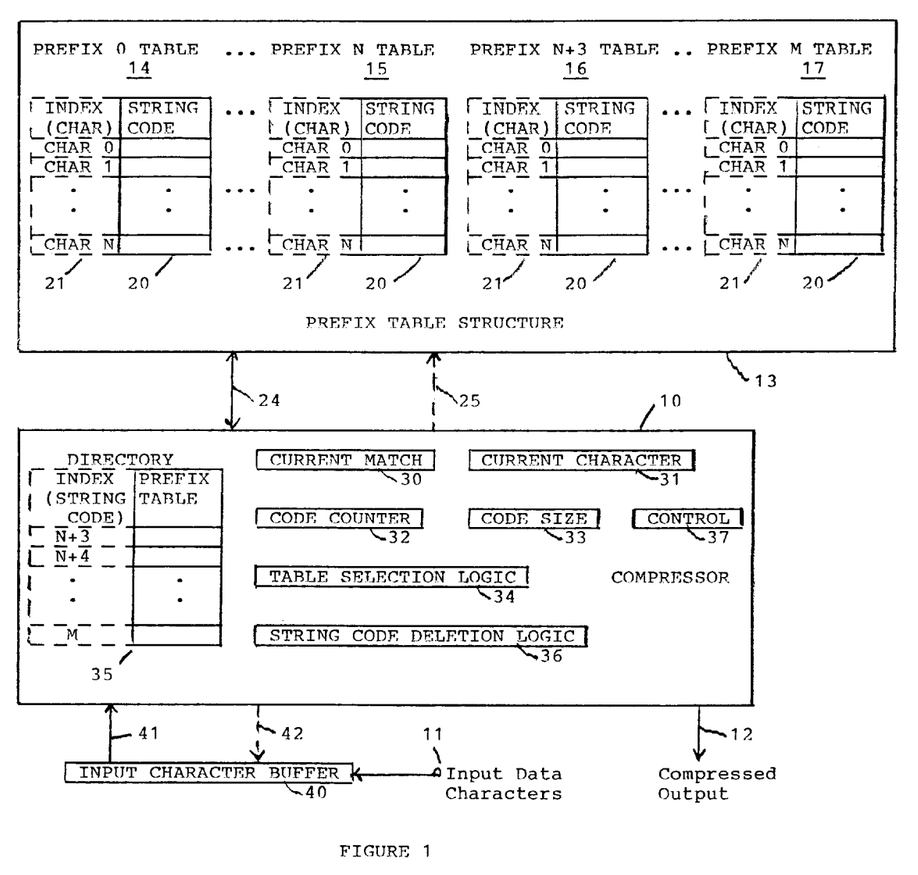
FIG. 1 is a schematic block diagram of a data compressor including string deletion processing in accordance with the present invention. In the embodiment of FIG. 1 the Prefix Tables are pre-established.

Referring to FIG. 1, a data compressor 10 is illustrated that compresses a stream of input data characters applied at an input 11 into a stream of corresponding compressed codes at an output 12. Included, is Prefix Table Structure 13 comprising Prefix Tables 14–17 corresponding to the respective prefix codes of the stored strings. Each of the Prefix Tables 14–17 is comprised of a plurality of Table locations 20 for storing the respective string codes of the data character strings stored in the Prefix Table Structure 13. The Table locations 20 of the Prefix Tables 14–17 are accessed by respective Indices 21.

A data character string is comprised of a prefix string of one or more characters followed by an extension character. A string is stored in the Prefix Table Structure 13 by storing the string code associated with the string in the Prefix Table 14–17 corresponding to the code of the string prefix at a Prefix Table location 20 corresponding to the extension character of the string. The extension character is utilized as the Index 21. Data is communicated between the compressor 10 and the Prefix Table Structure 13 via a bi-directional data bus 24 under control of a control bus 25.

In typical LZW data compressors, the dictionary is limited to 4096 string codes. When this limitation is applied to the present invention, the Prefix Tables may correspond, respectively, to prefix codes 0–4095. It is appreciated that when accounting for control codes, Prefix Tables corresponding to the control codes are not utilized. With an N+1 character alphabet having character values 0–N, the N+1 Indices 21 of each Prefix Table 14–17 correspond to the N+1 respective characters CHAR 0–CHAR N. The N+1 Table locations 20 are indexed by the respective character values. The first multiple character string code is N+3 and the maximum assignable string code M is 4095. The codes N+1 and N+2 may be utilized as control codes. It is appreciated that the single character prefix strings conveniently utilize the character values as the prefix codes. Thus, the Prefix Tables corresponding to the prefix codes 0–N store two character strings while strings having multiple character prefixes are stored in Prefix Tables N+3 to M.

In the ASCII environment, for example, N is 255 and the alphabet has an 8 bit character size supporting an alphabet of 256 characters having values of 0–255. The first available multiple character string code N+3 may, for example, be 258 where the control codes N+1 and N+2 are 256 and 257. Thus, in the ASCII environment the Prefix Tables corresponding to the prefix codes 0–255 store the two character strings.

The compressor 10 includes a Current Match register 30, a Current Character register 31, a Code Counter 32 and a Code Size register 33. The Code Counter 32 sequentially generates code values to be assigned to data character strings stored in the Prefix Table Structure 13 in a manner to be described. The Code Size register 33 is utilized, as is well known, to control the number of bits utilized for transmitting the compressed code from the output 12. Also included is table selection logic 34 for selecting the appropriate Prefix Table 14–17 in accordance with Current Match and string code reassignment in a manner to be described.

In accordance with the invention, the compressor 10 also includes Directory 35 and string code deletion logic 36. The Directory 35 is indexed by the string codes N+3 to M and is utilized to reference the Prefix Table in which an assigned string code is stored. The string code deletion logic 36 is utilized in reassigning string codes in accordance with the invention.

The compressor 10 additionally includes control 37 for controlling the operations of the compressor 10 in accordance with the operational flow charts of FIGS. 2 and 3 to be described below.

Further included is an Input Character Buffer 40 that buffers the input data character stream received at the input 11. The input data characters are applied from the Input Character Buffer 40 via a bus 41 to the Current Character register 31 and the Current Match register 30 in accordance with operations to be described. The compressor 10 controls acquiring input data characters from the Input Character Buffer 40 via a control bus 42.

Briefly, the operation of the compressor 10 is as follows. The compressor 10 is initialized by setting the Code Counter 32 to the first available multiple character string code and by setting the Code Size register 33 to the initial Code Size. Additionally, the Current Match register 30 and Directory 35 are cleared and the Prefix Tables 14–17 are cleared to empty. A first input data character is fetched to the Current Match register 30 to initiate a first compression cycle. To begin a subsequent compression cycle, the Current Match register 30 is set to contain the mismatching character determined from the preceding compression cycle.

At the beginning of a compression cycle, the next data character is fetched to the Current Character register 31. The Prefix Table 14–17 corresponding to Current Match is selected and the location corresponding to Current Character in the selected Prefix Table is accessed by Current Character utilizing the Indices 21. If the accessed location is not empty, the Current Match register 30 is set to the string code contained in the accessed location. The fetching of the next Current Character, the selection of the Prefix Table corresponding to Current Match and the accessing of the location corresponding to Current Character in the selected Prefix Table continues until the accessed location is empty.

When the accessed location is empty, the code in the Code Counter 32 is stored in the empty location and Current Match is stored in the Directory 35 at the location indexed by the code in the Code Counter 32. The code in the Current Match register 30 is output as the longest match and the Current Match register 30 is set to the mismatching character in the Current Character register 31. The Code Counter 32 is advanced to the next available code in a manner to be described in accordance with the present invention. Control returns to fetch the next data character to the Current Character register 31 to begin the search for the next longest match in the next compression cycle.

Figure 2:
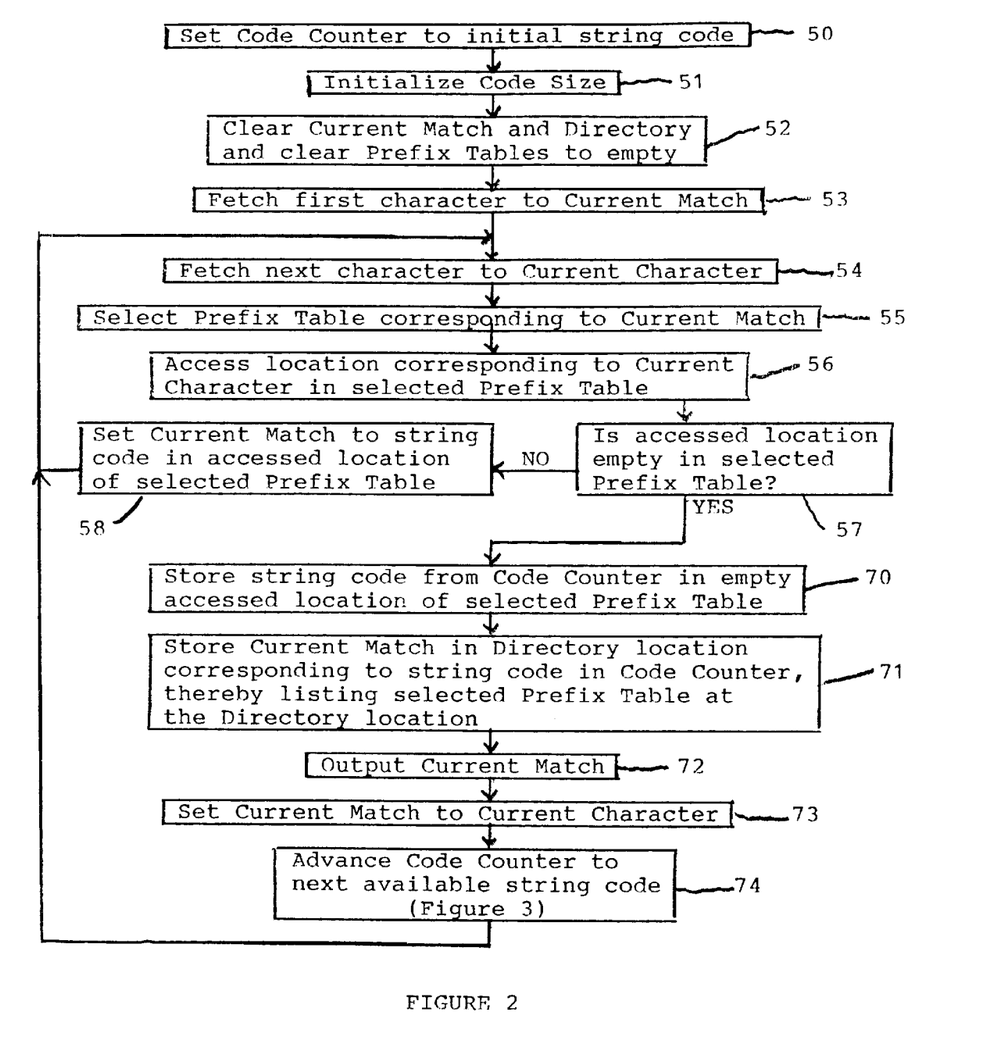
FIG. 2 is a control flow chart illustrating the operations executed by the compressor of FIG. 1.

Referring to FIG. 2, with continued reference to FIG. 1, a control flow chart is illustrated showing the detailed operations to be executed by the compressor 10. The control 37 of the compressor 10 is considered as containing appropriate circuitry, such as state machines, or appropriate software, to control execution of the operations. The flow chart of FIG. 2 is predicated on a variable length output and the Code Size register 33 is utilized to this effect. In an ASCII variable length code implementation, the Code Size may begin with 9 bits and sequentially increase to 10, 11 and 12 bits at codes 512, 1024 and 2048, respectively. It is appreciated that a fixed code size may also be utilized with appropriate modifications to the embodiment.

Control enters a block 50 whereat the Code Counter 32 is initialized to a first available code, for example, 258 in the ASCII environment. At a block 51, the Code Size register 33 is initialized to the beginning Code Size, for example, 9 bits in ASCII embodiments. At a block 52, the Current Match register 30 and Directory 35 are cleared and the Prefix Tables 14–17 are cleared to empty. Zero may be utilized in the locations 20 of the Prefix Tables to denote the empty state. At a block 53, the first input data character is fetched to the Current Match register 30 and, at a block 54, the next input data character is fetched to the Current Character register 31.

At a block 55, the Prefix Table 14–17 corresponding to Current Match is selected and, at a block 56, the location corresponding to Current Character in the selected Prefix Table is accessed via the Indices 21. The Table selection logic 34 is utilized to perform the Table selection. At a block 57, if the accessed location in the selected Prefix Table is not empty, the NO branch from the block 57 is taken to a block 58. At the block 58, the Current Match register 30 is set to the string code in the accessed location of the selected Prefix Table. Thereafter, control returns to the block 54 to fetch the next input data character to the Current Character register 31.

If, at the block 57, the accessed location in the selected Prefix Table is empty, the YES branch from the block 57 is taken to a block 70. When this occurs, the longest matching string in the Prefix Table Structure 13 has been determined. At the block 70, the code in the Code Counter 32 is stored in the empty accessed location of the selected Prefix Table thereby storing the appropriate extended string.

Control proceeds to a block 71 whereat Current Match in the Current Match register 30 is stored in the Directory 35 at the Directory location corresponding to the string code in the Code Counter 32. Thus, the Prefix Table selected at the block 55, in which the appropriate extended string is stored at the block 70, is recorded at the Directory location corresponding to the string code of the stored extended string.

Control proceeds to a block 72 whereat the code of the Current Match is output as part of the compressed code stream provided at the compressor output 12. The code of the Current Match is provided by the Current Match register 30 and is output utilizing the number of bits denoted by the Code Size register 33. When Current Match is a multiple character string, the code of the string resides in the Current Match register 30 and was the longest match found in the Prefix Table Structure 13 as described above with respect to the block 57. It is appreciated that the Current Match output at the block 72 can also be a single character. The output code in this case is the value of the character which is also provided from the Current Match register 30.

Processing proceeds to a block 73 whereat the character in the Current Character register 31 is set into the Current Match register 30. Thus, the Current Match register 30 is set with the character that resulted in the mismatch at the block 57.

Processing then proceeds to a block 74 whereat the code in the Code Counter 32 is advanced to a next available string code. Details of the processing of the block 74 are described with respect to FIG. 3. Control then returns to the block 54 to begin the next compression cycle with the mismatching character set into the Current Match register 30.

It is appreciated from the foregoing that the loop comprising the blocks 54–58 sequentially fetch the input data characters which index the Prefix Tables selected by Current Match to determine if the strings represented by Current Match extended by Current Character are stored in the Prefix Table Structure. When the YES branch is taken from the block 57, the longest matching string has been determined with the code thereof in the Current Match register and the mismatching character in the Current Character register. The extended string comprising the longest match extended by the mismatching character is readily stored in the Prefix Table Structure by, at the block 70, inserting the code in the Code Counter into the empty location accessed by Current Character in the Prefix Table selected by Current Match.

Figure 3:
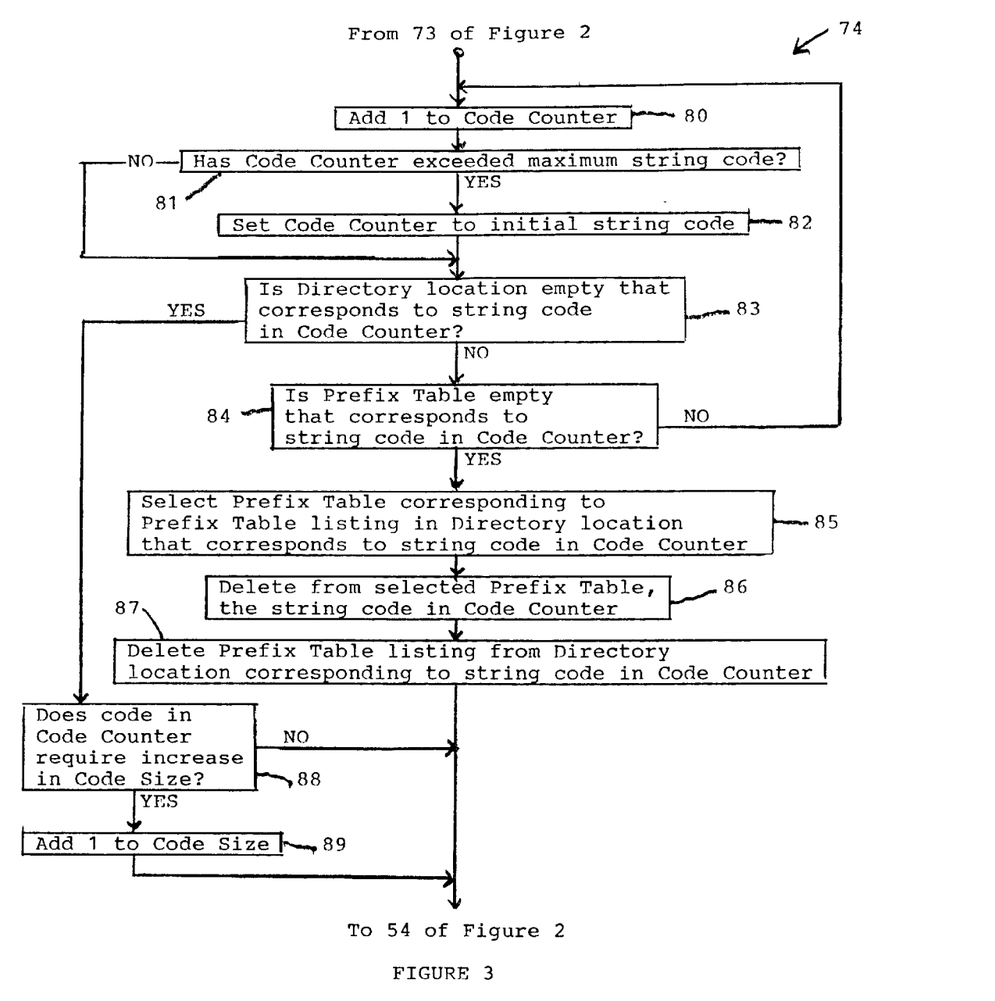
FIG. 3 is a control flow chart illustrating details of the string deletion processing of FIG. 2.

Referring to FIG. 3, with continued reference to FIGS. 1 and 2, a control flow chart providing the details of block 74 of FIG. 2 is illustrated. In the FIG. 3 processing, the Code Counter 32 is advanced from the initial string code to the maximum string code and the codes from the Code Counter are assigned to respective strings stored in the Prefix Table Structure 13. When the Code Counter exceeds the maximum string code, the codes are recycled and selectively reassigned to new strings. The Directory 35 is utilized to determine if a string code is assigned and, if so, in which Prefix Table the string code is stored. A previously assigned string code is reused if the string corresponding thereto has not been extended. The Prefix Table corresponding to the string code is utilized to effect this determination. If the candidate string code is reassigned, the previous string is deleted.

Accordingly, from block 73 of FIG. 2, control enters a block 80 whereat the Code Counter 32 is incremented by 1. At a block 81, a test is performed to determine if the Code Counter 32 has exceeded the maximum string code M. Conveniently, the test may be effected by examining the Code Counter overflow. If as the result of incrementing the Code Counter at the block 80, the Code Counter exceeds the maximum string code at the block 81, the YES branch is taken from the block 81 to a block 82. At the block 82, the Code Counter 32 is reset to the initial string code. Processing then proceeds to a block 83.

If, at the block 81, the Code Counter 32 has not exceeded the maximum string code M, the NO branch is taken from the block 81 directly to the block 83 bypassing block 82.

At the block 83, the Directory 35 is accessed to determine if the Directory location corresponding to the string code in the Code Counter 32 is empty. If the accessed Directory location is empty, the string code in the Code Counter 32 has not yet been assigned to a string and the YES branch from the block 83 is taken through Code Size adjusting blocks 88 and 89 directly to the block 54 of FIG. 2 for continued processing. It is appreciated that in the next processing cycle of FIG. 2, the code in the Code Counter 32 is assigned to the next extended string to be stored in the Prefix Table Structure 13.

If at the block 83, the accessed Directory location is not empty, the string code in the Code Counter 32 is already assigned to a stored extended string and the NO branch from the block 83 is taken to a block 84. The block 84 processing determines if the string corresponding to the string code in the Code Counter 32 has been further extended. Accordingly, at the block 84, a test is effected to determine if the Prefix Table corresponding to the string code in the Code Counter 32 is empty. If the Prefix Table is not empty, the NO branch from the block 84 is taken back to the block 80 to continue processing with a new string code candidate.

If, at the block 84, the Prefix Table corresponding to the string code in the Code Counter is empty, the YES branch from the block 84 is taken to a block 85. At the block 85, the Prefix Table that is listed in the Directory location corresponding to the string code in the Code Counter is selected. At a block 86, the string code in the Code Counter is deleted from the Prefix Table selected at the block 85 and, at a block 87, the Prefix Table listing in the Directory location corresponding to the string code in the Code Counter is deleted. Control then returns to block 54 of FIG. 2 for continued processing. It is appreciated that in the next processing cycle of FIG. 2, the code in the Code Counter 32 is reassigned to the next extended string to be stored in the Prefix Table Structure 13.

When the YES branch is taken from the block 83, processing proceeds to block 88 whereat the code in the Code Counter 32 is tested to determine if an increase in Code Size is required. If so, processing continues to block 89 whereat the Code Size register 33 is incremented by 1. Control then returns to the block 54 of FIG. 2 either from the NO branch of block 88 or from block 89 to begin the next compression cycle.

It is appreciated that when the NO branch is taken from the block 83, the Prefix Table listing in the Directory location corresponding to string code in Code Counter is utilized in the processing of blocks 85–87. The Prefix Table listing is utilized in the blocks 85 and 86 to select the Prefix Table from which the string code in Code Counter is deleted and in the block 87 to delete the Directory Prefix Table listing therefor. The string code deletion logic 36 of FIG. 1 performs the processing of the blocks 85–87.

It is also appreciated that in the first cycling of the codes in the Code Counter, the NO branch is taken from the block 81 and the YES branch is taken from the block 83 through the blocks 88 and 89 directly to the block 54 of FIG. 2. In the subsequent recycling of the codes, the NO branch is always taken from the block 83 for string code reassignment.

Figure 4:
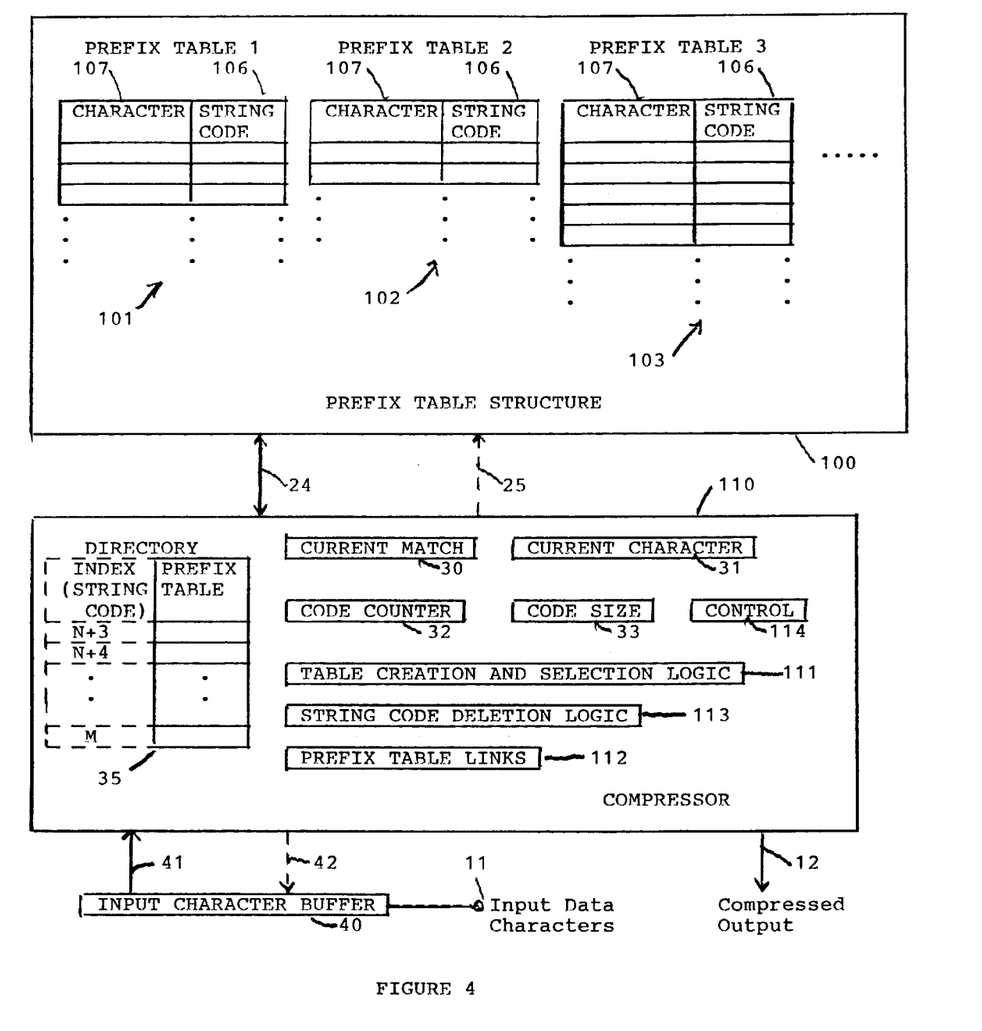
FIG. 4 is a schematic block diagram of an alternative embodiment of a data compressor including string deletion processing in accordance with the present invention. In the embodiment of FIG. 4, the Prefix Tables and the locations thereof are established when required.

Referring to FIG. 4, in which like reference numerals indicate like components with respect to FIG. 1 and with continued reference to FIGS. 1–3, an alternative embodiment of the data compressor of the present invention is illustrated. Although the embodiment of FIG. 4 is configured and operates in a manner similar to that described above with respect to FIGS. 1–3, the FIG. 4 embodiment includes significant additional features that provide further enhancements.

The embodiment of FIGS. 1–3 utilize pre-established Prefix Tables as described. In the FIG. 4 embodiment, a Prefix Table is established when the string corresponding thereto is first matched in the input. As a further feature, a location in a Prefix Table is established when the location is required in which to store the above described extended string. By utilizing these additional features, only Prefix Table memory actually utilized by the operation of the compressor is required.

Accordingly, the FIG. 4 embodiment includes Prefix Table Structure 100 illustrating Prefix Tables 101–103. Each Prefix Table 101–103 is established when the code of the prefix string corresponding thereto is first encountered in the Current Match register 30. In order to facilitate implementation of the additional features of the FIG. 4 embodiment, a Prefix Table 101–103 includes a location 106 in which to store the code of a string and a corresponding location in which to store the string extension character. The stored characters provide a Character List 107 with which to index and access the corresponding String Codes 106.

The embodiment of FIG. 4 includes compressor 110 comprising the previously described Current Match register 30, Current Character register 31, Code Counter 32, Code Size register 33 and Directory 35. In addition, the compressor 110 includes table creation and selection logic 111 and Prefix Table Links 112 utilized in the "on-the-fly" creation of the Prefix Table Structure 100. The Prefix Table Links 112 may be configured as a look-up table indexed by the individual prefix codes to provide a respective address link to the corresponding Prefix Table in the Prefix Table Structure 100. If a link is not stored for a prefix code, the Prefix Table for that prefix code has not yet been established. When a string is matched for the first time by the compressor 110 and the code thereof set into the Current Match register 30, the logic 111 selects an address link for storage in the Prefix Table Links 112 to correspond to the newly encountered Current Match. The logic 111 then creates the Prefix Table linked by this address so as to provide the Prefix Table corresponding to the code.

The compressor 110 also includes string code deletion logic 113 similar to the logic 36 discussed above with respect to FIGS. 1 and 3. In the logic 113, however, both the string code and extension character are deleted from a Prefix Table in a manner to be described with respect to FIG. 6.

Figure 5:
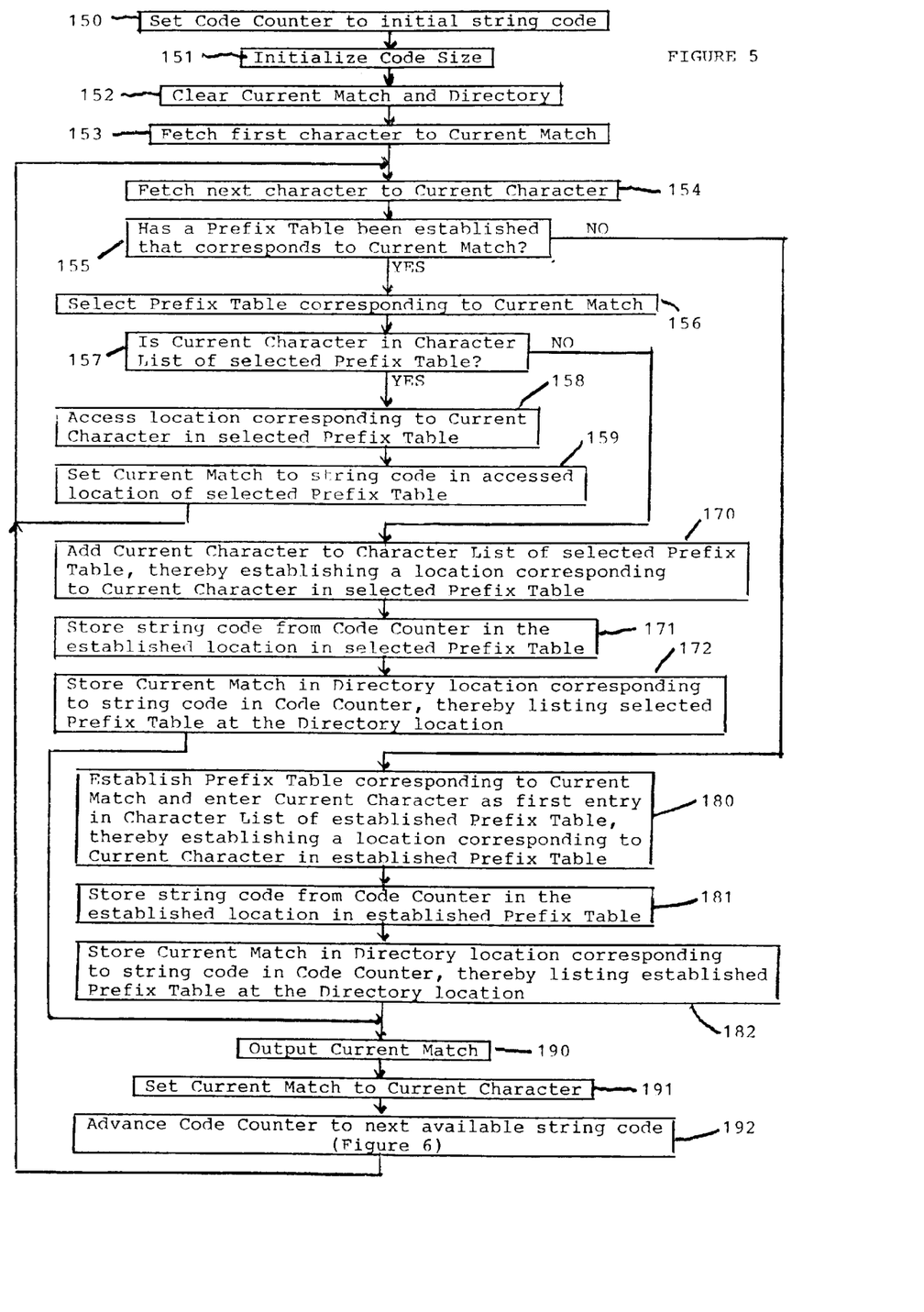
FIG. 5 is a control flow chart illustrating the operations executed by the compressor of FIG. 4.
Figure 6:
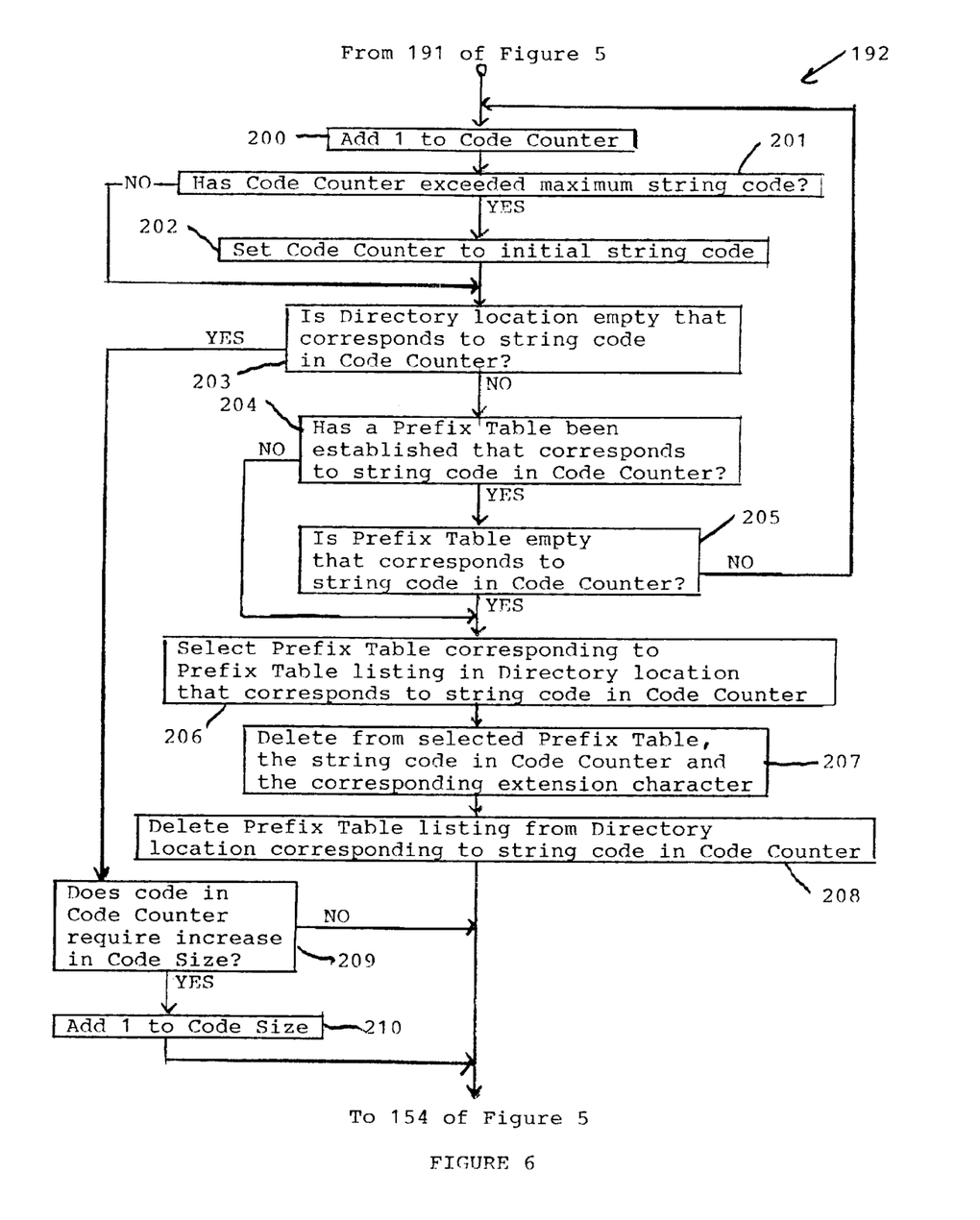
FIG. 6 is a control flow chart illustrating details of the string deletion processing of FIG. 5.

The compressor 110 additionally includes control 114 for controlling the operations of the compressor 110 in accordance with the operational flow charts of FIGS. 5 and 6.

Referring to FIG. 5, with continued reference to FIGS. 1, 2 and 4, a control flow chart is illustrated showing the detailed operations to be executed by the compressor 110. The control 114 of the compressor 110 is considered as containing appropriate circuitry, such as state machines, or appropriate software, to control execution of the operations. The flow chart of FIG. 5 is predicated on a variable length output in the manner described above with respect to FIG. 2. The descriptions given above with respect to FIG. 2 apply, where applicable, to the flow chart of FIG. 5.

Control enters blocks 150–154 to perform functions similar to those described above with respect to blocks 50–54, respectively, of FIG. 2. It is noted at block 152 that the Current Match register 30 and Directory 35 are cleared. The Prefix Tables that were cleared at block 52 of FIG. 2 are not as yet established in the FIG. 4 embodiment.

At a block 155, the compressor 110 determines if a Prefix Table has been established for Current Match. The Prefix Table Links 112 are consulted to effect this determination. If at the block 155, a Prefix Table has been established for Current Match, the YES branch is taken from the block 155 to a block 156. At the block 156, the Prefix Table corresponding to Current Match is selected utilizing the table creation and selection logic 111.

At a block 157, the Current Character is compared to the Character List 107 of the selected Prefix Table to determine if Current Character is in the Character List. The Character List may be searched associatively for Current Character or, alternatively, the Character List may comprise an ordered and linked list of characters so as to effect the comparison with Current Character. Other list searching procedures known in the art may be utilized to the same effect. If Current Character is found in the Character List, the YES branch is taken from the block 157 to a block 158.

At the block 158, the location corresponding to Current Character in the selected Prefix Table is accessed and, at a block 159, the Current Match register 30 is set to the string code in the accessed location of the selected Prefix Table. Control then returns to the block 154 to fetch the next character to the Current Character register 31 to continue the search for the longest match.

It is appreciated that the loop comprised of the blocks 154–159 searches for the longest matching string in the Prefix Table Structure 100 generally as described above with respect to the blocks 54–58 of FIG. 2. In the FIG. 4 embodiment, when Current Character is found in the Character List at the block 157, the longest match is not yet determined. When, however, at the block 157, Current Character is not in the Character List of the selected Prefix Table, the longest match has been determined and the NO branch from the block 157 is taken to a block 170.

Accordingly, at the block 170, Current Character in the Current Character register 31 is added to the Character List 107 of the selected Prefix Table. Thus, at the block 170, a location is established in the selected Prefix Table that corresponds to Current Character. If the Character List comprises an ordered and linked list, the Current Character is inserted and linked into the Character List in the appropriate order. At a block 171, the code from the Code Counter 32 is stored in the String Code field at the location in the selected Prefix Table that was established at the block 170. It is appreciated that the block 171 of FIG. 5 corresponds to the block 70 of FIG. 2 in the operational flow whereat the appropriate extended string is stored. At a block 172, the Directory 35 is updated with a listing for the selected Prefix Table in the manner described above with respect to the block 71 of FIG. 2.

Control proceeds from the block 172 to blocks 190–192 whereat the functions described above with respect to blocks 72–74 of FIG. 2 are performed with the details of block 192 described with respect to FIG. 6. After executing the functions of block 192, control returns to the block 154 to fetch the next input character to the Current Character register 31 to begin the next compression cycle.

If, at the block 155, a Prefix Table has not been established for Current Match, the NO branch from the block 155 is taken to a block 180. At the block 180, a Prefix Table corresponding to Current Match is established and Current Character is entered as the first entry in the Character List 107 of the established Prefix Table. This first entry thereby establishes a String Code location 106 corresponding to Current Character in the established Prefix Table. The table creation and selection logic 111 and the Prefix Table Links 112 are utilized, as described above, in establishing the Prefix Table.

At a block 181, the code from the Code Counter 32 is stored in the established String Code location 106 in the established Prefix Table. Thus the appropriate extended string is stored, as in the block 171, in the manner described above with respect to the block 70 of FIG. 2. At a block 182, the Directory 35 is updated, as in block 172, in the manner described above with respect to the block 71 of FIG. 2. Control then proceeds to the blocks 190–192 as previously described.

Referring to FIG. 6, with continued reference to FIGS. 1–5, a control flow chart providing the details of block 192 of FIG. 5 is illustrated. The flow chart of FIG. 6 is generally the same as that of FIG. 3 and the descriptions given above with respect to FIG. 3 are applicable thereto. Specifically, blocks 200–203, 205–210 of FIG. 6 correspond to blocks 80–89 of FIG. 3, respectively. It is noted, however, that a block 204 is interposed between the NO branch of block 203 and the block 205 to determine if a Prefix Table has been established that corresponds to the string code in the Code Counter 32. If so, the YES branch from the block 204 is taken to the block 205. If the Prefix Table that corresponds to the string code in the Code Counter has not been established, the NO branch from the block 204 is taken directly to the block 206, bypassing the block 205.

It is further noted at block 207 that the string code in the Code Counter as well as the corresponding extension character is deleted from the selected Prefix Table.

Although the FIG. 4 embodiment was described in terms of "on-the-fly" creation of the Prefix Tables as well as of the locations thereof, it is appreciated that these features can also be used separately. If the Prefix Table establishing feature is separately utilized, a complete Prefix Table, as illustrated in FIG. 1, may be established and indexed in the manner described above with respect to FIG. 1. In such an embodiment, Prefix Table locations would be tested for the empty status as described with respect to block 57 of FIG. 2 rather than utilizing the Character List as described with respect to FIGS. 4 and 5.

If the Prefix Table location establishing feature is separately utilized, the Prefix Table links 112 of FIG. 4 would not be used as described. Instead, pre-established Prefix Tables with Character Lists would be utilized.

It is appreciated that when no further input data characters are available, the above described embodiments will output Current Match to conclude the processing.

It is further appreciated that in the above described embodiments, a string code is reassigned if the string corresponding thereto has not been extended. In the FIG. 1 embodiment, a string code is reassigned if the Prefix Table corresponding to the string code is empty as indicated at the block 84 of FIG. 3. In the FIG. 4 embodiment, the string code is reassigned if the Prefix Table corresponding to the string code has not been established or is empty as indicated at the blocks 204 and 205 of FIG. 6.

It is also appreciated with respect to the FIG. 4 embodiment, that once a Prefix Table is established, it remains established even if the deletion process causes the Prefix Table to become empty.

In the above described embodiments, it is appreciated that string codes are reassigned in a close approximation to a Least Recently Used (LRU) protocol. Limiting the range of assignable string codes limits the maximum bit size of the assignable codes thereby tending to improve compression.

Although the above described embodiments of the invention are LZW based, it is appreciated that the architecture of the present invention can be utilized with other known dictionary based compression methodologies. It is furthermore appreciated that the input data characters can be over any size alphabet having any corresponding character bit size. For example, the data characters can be textual data, image pixel data or bit map data. The input data can also be binary characters over the two-character binary alphabet 1 and 0 having a 1-bit size character.

It is appreciated that the above described embodiments of the invention may be implemented in hardware, firmware, software or a combination thereof. Discrete circuit embodiments may readily be implemented for performing the various described functions. In a software embodiment, appropriate modules programmed with coding readily generated from the above descriptions may be utilized.

While the invention has been described in its preferred embodiments, it is to be understood that the words which have been used are words of description rather than of limitation and that changes may be made within the purview of the appended claims without departing from the true scope and spirit of the invention in its broader aspects.

What is claimed is:

1. A data compression method for compressing an input stream of data characters into an output stream of compressed codes, said data characters being from an alphabet of data characters, comprising providing a plurality of prefix tables corresponding to a respective plurality of codes, storing, in said prefix tables, strings of data characters encountered in said input stream, said stored strings having respective codes assigned thereto, a string comprising a prefix string of at least one of said characters followed by an extension character, a prefix string having a code associated therewith, a particular string being stored in said prefix tables by storing the code associated with said particular string in the prefix table corresponding to the code of the prefix string of said particular string at a prefix table location corresponding to the extension character of said particular string, searching said input stream by comparing said input stream to said stored strings to determine the longest match therewith, outputting the code associated with said longest match so as to provide said output stream of compressed codes, inserting an extended string into said prefix tables, said extended string comprising said longest match extended by the next data character in said input stream following said longest match, said extended string being stored in the prefix table corresponding to said code of said longest match, assigning a code to said extended string, and deleting a code from a prefix table for reassignment to an extended string to be inserted when further codes are unavailable for assignment.

2. The compression method of claim 1 wherein said deleting step includes selecting a code for reassignment by determining that the prefix table corresponding to the code indicates that the string represented by the code has not been extended.

3. The compression method of claim 2 wherein said deleting step includes selecting the code for reassignment by determining that the prefix table corresponding to the code is empty.

4. The compression method of claim 2 wherein said deleting step includes selecting the code for reassignment by determining that a prefix table corresponding to the code has not been established.

5. The compression method of claim 1 wherein said assigning step includes advancing a sequence of codes to a next code, determining if said next code is assigned to a string stored in said prefix tables, and assigning said next code to an extended string if said next code is not assigned to a stored string.

6. The compression method of claim 2 wherein said code assigned to said extended string is from a sequence of codes and said assigning step includes
    (a) advancing said sequence of codes to a next code,
    (b) determining if said next code is assigned to a string stored in said prefix tables,
    (c) if said next code is assigned to a stored string, determining if the prefix table corresponding to said next code indicates that the string represented by said next code has been extended, and
    (d) repeating steps (a) through (c) until the prefix table corresponding to said next code indicates that the string represented by said next code has not been extended, said next code thereby being selected for reassignment.

7. The compression method of claim 1 further including utilizing a directory of string codes listing the prefix tables in which said string codes are stored, said directory being utilized to determine if a string code is assigned to a stored string and, if assigned, the prefix table in which the string code is stored.

8. The compression method of claim 1 wherein said searching step includes searching for a string in the prefix table corresponding to the code of the string prefix by determining if a location in the prefix table exists corresponding to the extension character of the string that is storing the code of the string.

9. The compression method of claim 8 wherein said searching step includes searching for a string by determining if a prefix table corresponding to the code of the string prefix has been established.

10. The compression method of claim 1 wherein said searching step includes
    (a) matching one of said stored strings thereby providing a current match,
    (b) fetching the next data character from said input stream following said current match thereby providing a current character,
    (c) determining if the location corresponding to said current character in a prefix table corresponding to said current match is empty, and
    (d) if said location is not empty, setting said current match to the string code stored in said location and repeating steps (b) through (d) until the location of step (c) is determined to be empty, thereby determining said longest match.

11. The compression method of claim 10 wherein, if said location in step (c) is determined to be empty, said outputting step comprises outputting said current match.

12. The compression method of claim 10 wherein, if said location in step (c) is determined to be empty, said inserting step includes providing a next available string code, and storing said next available string code in said empty location, thereby inserting said extended string into said prefix table corresponding to said current match.

13. The compression method of claim 11 wherein said compression method operates in compression cycles, further including setting said current match to said current character in preparation for performing a next compression cycle.

14. The compression method of claim 1 further comprising creating a particular prefix table corresponding to a particular code when the string corresponding to said particular code is first matched.

15. The compression method of claim 1 wherein a prefix table includes a list of characters corresponding to respective locations of said prefix table.

16. The compression method of claim 15 wherein said deleting step further includes deleting, from said list of characters in the prefix table from which the code is deleted for reassignment, the character corresponding to the deleted code.

17. The compression method of claim 15 wherein said searching step includes
   (a) matching one of said stored strings thereby providing a current match,
   (b) fetching the next data character from said input stream following said current match thereby providing a current character,
   (c) determining if said current character is one of the characters in the character list of said prefix table corresponding to said current match, and
   (d) if said current character is one of said characters in said character list, setting said current match to the code stored in the prefix table location corresponding to said one of said characters and repeating steps (b) through (d) until said current character of step (c) is determined not to be one of said characters in said character list, thereby determining said longest match.

18. The compression method of claim 17 wherein, if in step (c) said current character is determined not to be one of said characters in said character list,
   said outputting step comprises outputting said current match.

19. The compression method of claim 17 wherein, if in step (c) said current character is determined not to be one of said characters in said character list, said inserting step includes
   storing said current character in said character list of said prefix table corresponding to said current match, thereby establishing a location corresponding to said current character in said prefix table corresponding to said current match,
   providing a next available string code, and
   storing said next available string code in said established location,
   thereby inserting said extended string into said prefix table corresponding to said current match.

20. The compression method of claim 18 wherein said compression method operates in compression cycles, further including
   setting said current match to said current character in preparation for performing a next compression cycle.

21. Data compression apparatus for compressing an input stream of data characters into an output stream of compressed codes, said data characters being from an alphabet of data characters, comprising
   a plurality of prefix tables corresponding to a respective plurality of codes,
   said prefix tables storing strings of data characters encountered in said input stream, said stored strings having respective codes assigned thereto, a string comprising a prefix string of at least one of said characters followed by an extension character, a prefix string having a code associated therewith,
   a particular string being stored in said prefix tables by storing the code associated with said particular string in the prefix table corresponding to the code of the prefix string of said particular string at a prefix table location corresponding to the extension character of said particular string,
   means for searching said input stream by comparing said input stream to said stored strings to determine the longest match therewith,
   means for outputting the code associated with said longest match so as to provide said output stream of compressed codes,
   means for inserting an extended string into said prefix tables, said extended string comprising said longest match extended by the next data character in said input stream following said longest match, said extended string being stored in the prefix table corresponding to said code of said longest match,
   means for assigning a code to said extended string, and
   means for deleting a code from a prefix table for reassignment to an extended string to be inserted when further codes are unavailable for assignment.

22. The compression apparatus of claim 21 wherein said deleting means includes means for selecting a code for reassignment by determining that the prefix table corresponding to the code indicates that the string represented by the code has not been extended.

23. The compression apparatus of claim 22 wherein said deleting means includes means for selecting the code for reassignment by determining that the prefix table corresponding to the code is empty.

24. The compression apparatus of claim 22 wherein said deleting means includes means for selecting the code for reassignment by determining that a prefix table corresponding to the code has not been established.

25. The compression apparatus of claim 21 wherein said assigning means includes
   means for advancing a sequence of codes to a next code,
   means for determining if said next code is assigned to a string stored in said prefix tables, and
   means for assigning said next code to an extended string if said next code is not assigned to a stored string.

26. The compression apparatus of claim 22 wherein said code assigned to said extended string is from a sequence of codes and said assigning means comprises means operative for
   (a) advancing said sequence of codes to a next code,
   (b) determining if said next code is assigned to a string stored in said prefix tables,
   (c) if said next code is assigned to a stored string, determining if the prefix table corresponding to said next code indicates that the string represented by said next code has been extended, and
   (d) repeating (a) through (c) until the prefix table corresponding to said next code indicates that the string represented by said next code has not been extended, said next code thereby being selected for reassignment.

27. The compression apparatus of claim 21 further including
   a directory of string codes listing the prefix tables in which said string codes are stored, said directory being utilized to determine if a string code is assigned to a stored string and, if assigned, the prefix table in which the string code is stored.

28. The compression apparatus of claim 21 wherein said searching means includes
   means for searching for a string in the prefix table corresponding to the code of the string prefix by determining if a location in the prefix table exists corresponding to the extension character of the string that is storing the code of the string.

29. The compression apparatus of claim 28 wherein said searching means includes means for searching for a string by determining if a prefix table corresponding to the code of the string prefix has been established.

30. The compression apparatus of claim 21 wherein said searching means comprises means operative for
  (a) matching one of said stored strings thereby providing a current match,
  (b) fetching the next data character from said input stream following said current match thereby providing a current character,
  (c) determining if the location corresponding to said current character in a prefix table corresponding to said current match is empty, and
  (d) if said location is not empty, setting said current match to the string code stored in said location and repeating (b) through (d) until the location of (c) is determined to be empty, thereby determining said longest match.

31. The compression apparatus of claim 30 wherein said outputting means comprises means for outputting said current match.

32. The compression apparatus of claim 30 wherein said inserting means includes
  means for providing a next available string code, and
  means for storing said next available string code in said empty location,
  thereby inserting said extended string into said prefix table corresponding to said current match.

33. The compression apparatus of claim 31 wherein said compression apparatus operates in compression cycles, further including
  means for setting said current match to said current character in preparation for performing a next compression cycle.

34. The compression apparatus of claim 21 further comprising
  means for creating a particular prefix table corresponding to a particular code when the string corresponding to said particular code is first matched.

35. The compression apparatus of claim 21 wherein a prefix table includes a list of characters corresponding to the respective locations of said prefix table.

36. The compression apparatus of claim 35 wherein said deleting means further includes means for deleting, from said list of characters in the prefix table from which the code is deleted for reassignment, the character corresponding to the deleted code.

37. The compression apparatus of claim 35 wherein said searching means comprises means operative for
  (a) matching one of said stored strings thereby providing a current match,
  (b) fetching the next data character from said input stream following said current match thereby providing a current character,
  (c) determining if said current character is one of the characters in the character list of said prefix table corresponding to said current match, and
  (d) if said current character is one of said characters in said character list, setting said current match to the code stored in the prefix table location corresponding to said one of said characters and repeating (b) through (d) until said current character of (c) is determined not to be one of said characters in said character list,
  thereby determining said longest match.

38. The compression apparatus of claim 37 wherein said outputting means comprises means for outputting said current match.

39. The compression apparatus of claim 37 wherein said inserting means includes
  means for storing said current character in said character list of said prefix table corresponding to said current match, thereby establishing a location corresponding to said current character in said prefix table corresponding to said current match,
  means for providing a next available string code, and
  means for storing said next available string code in said established location,
  thereby inserting said extended string into said prefix table corresponding to said current match.

40. The compression apparatus of claim 38 wherein said compression apparatus operates in compression cycles, further including
  means for setting said current match to said current character in preparation for performing a next compression cycle.

* * * * *